United States Patent
Raos et al.

(10) Patent No.: US 7,315,049 B2
(45) Date of Patent: Jan. 1, 2008

(54) LED ASSEMBLY WITH VENTED CIRCUIT BOARD

(75) Inventors: Robert Bogdan Raos, Monte Sereno, CA (US); Nilesh T Desai, San Jose, CA (US); Steven Flank, Washington, DC (US)

(73) Assignee: OnScreen Technologies, Inc., Safety Harbor, FL (US)

( * ) Notice: Subject to any disclaimer, the term of this patent is extended or adjusted under 35 U.S.C. 154(b) by 0 days.

(21) Appl. No.: 11/538,786

(22) Filed: Oct. 4, 2006

(65) Prior Publication Data

US 2007/0081341 A1    Apr. 12, 2007

Related U.S. Application Data

(62) Division of application No. 10/847,343, filed on May 18, 2004, now Pat. No. 7,138,659.

(51) Int. Cl.
*H01L 33/00* (2006.01)

(52) U.S. Cl. .............................. 257/99; 257/100; 257/98

(58) Field of Classification Search ........... 257/88–104
See application file for complete search history.

(56) References Cited

U.S. PATENT DOCUMENTS

| | | | |
|---|---|---|---|
| 4,077,144 A | 3/1978 | Smits | |
| 4,241,277 A | 12/1980 | Hintze et al. | |
| 4,394,600 A | 7/1983 | Flannagan | |
| 4,937,654 A | 6/1990 | Hirabayashi | |
| 5,059,373 A | 10/1991 | Hirabayashi | |
| 5,471,371 A | 11/1995 | Koppulu et al. | |
| 5,478,778 A | 12/1995 | Tanisawa | |
| 5,550,721 A | 8/1996 | Rapisarda | |
| 5,632,551 A | 5/1997 | Roney et al. | |
| 5,719,444 A | 2/1998 | Tilton et al. | |
| 5,746,497 A | 5/1998 | Machida | |
| 5,806,965 A | 9/1998 | Deese | |
| 5,857,767 A | 1/1999 | Hochstein | |
| 6,116,759 A | 9/2000 | Smith | |
| 6,175,342 B1 | 1/2001 | Nicholsen et al. | |
| 6,238,056 B1 | 5/2001 | Rapisarda | |

(Continued)

FOREIGN PATENT DOCUMENTS

DE        19816227 A1    10/1999

(Continued)

OTHER PUBLICATIONS

U.S. Appl. No. 60/405,826, filed Aug. 26, 2002.

(Continued)

*Primary Examiner*—Cuong Nguyen
(74) *Attorney, Agent, or Firm*—Banner & Witcoff, Ltd

(57) ABSTRACT

A light emitting diode (LED) assembly with a vented printed circuit board is disclosed. A printed circuit board assembly may include a plurality of LED modules disposed in an array with a multilayered substrate and a plurality of vents. The multilayer substrate may include a thermal cooling layer which is in thermal communication with the LED modules for heat dissipation. The multilayer substrate may include one or more electrical power layers in electrical communication with the LED modules for energizing the LEDs. The multilayered substrate may have an external insulating layer that includes a plurality of fluid apertures configured for fluid communication with the thermal cooling layer.

1 Claim, 17 Drawing Sheets

U.S. PATENT DOCUMENTS

| | | |
|---|---|---|
| 6,283,613 B1 | 9/2001 | Schaffer |
| 6,390,643 B1 | 5/2002 | Knight |
| 6,402,347 B1 | 6/2002 | Maas et al. |
| 6,414,650 B1 | 7/2002 | Nicholson et al. |
| 6,480,389 B1 | 11/2002 | Shie et al. |
| 6,652,127 B2 | 11/2003 | Tarabula |
| 6,813,853 B1 | 11/2004 | Tucker |
| 6,831,305 B2 | 12/2004 | Yasukawa et al. |
| 2002/0074557 A1 | 6/2002 | Uda et al. |
| 2003/0021121 A1 | 1/2003 | Pederson |
| 2003/0048912 A1 | 3/2003 | Reich |
| 2003/0063463 A1 | 4/2003 | Sloan et al. |
| 2003/0072153 A1 | 4/2003 | Nobuyuki et al. |
| 2003/0076033 A1 | 4/2003 | Jiahn-Chang |
| 2003/0098460 A1 | 5/2003 | Yasukawa et al. |
| 2003/0112627 A1 | 6/2003 | Deese |
| 2004/0125515 A1 | 7/2004 | Popovich |
| 2005/0018424 A1 | 1/2005 | Popovich |
| 2005/0178034 A1 | 8/2005 | Schubert et al. |

FOREIGN PATENT DOCUMENTS

| | | |
|---|---|---|
| EP | 377352 A1 | 7/1990 |
| EP | 0 709 819 A | 5/1998 |
| JP | 57095682 A | 6/1982 |
| JP | 02278282 A | 11/1990 |
| JP | 04290478 A | 10/1992 |
| JP | 05072978 A | 3/1993 |
| JP | 05074975 A | 3/1993 |
| JP | 05134615 A | 5/1993 |
| JP | 06151915 A | 5/1994 |
| JP | 06314863 A | 11/1994 |
| JP | 11052886 A | 2/1999 |
| JP | 2002244591 A | 8/2002 |
| JP | 2002/270007 A | 9/2002 |
| JP | 2003223121 A | 8/2003 |
| WO | PCT/US2005/009302 | 7/1998 |
| WO | PCT/US2005/009302 | 1/2004 |
| WO | WO 2004/019657 A | 3/2004 |

OTHER PUBLICATIONS

International Search Report of PCT/US03/25913 dated Mar. 18, 2004.

Written Opinion of PCT/US03/25913 dated May 21, 2004.

LED ASSEMBLY WITH VENTED CIRCUIT BOARD

CROSS REFERENCE TO RELATED APPLICATIONS

This application is a divisional application of U.S. patent application Ser. No. 10/847,343, filed May 18, 2004 now U.S. Pat. No. 7,138,659 and entitled "LED Assembly with Vented Circuit Board," the contents of which are incorporated herein by reference.

FIELD OF THE INVENTION

The invention relates to lighting units using light emitting diodes (LEDs). More particularly, the invention relates to a light emitting diode assembly with a vented circuit board.

BACKGROUND OF THE INVENTION

Light-emitting diodes (LEDS) have been used for signs and other types of illuminated displays for many years. As a byproduct of operation, display assemblies having LEDs generate heat as electric current flows through the devices. The heat must be dissipated or removed to prevent overheating. Cooling a display assembly is important in order to preserve its functionality and efficiency. Furthermore, display assemblies when used in outdoor environments may be exposed to wind forces that affect loading on the assemblies. One approach for cooling an LED display assembly is shown in PCT publication WO2004019657. The publication generally shows a coolant fluid which cools LEDs using a mesh design.

BRIEF SUMMARY OF THE INVENTION

In one variation, a printed circuit board assembly includes a plurality of LEDs disposed in a grid pattern at junctions in which the junctions are interconnected by adjacent bridges defining air vents. A plurality of vents enables air to pass through the printed circuit board assembly, thus reducing wind resistance and promoting cooling.

In another variation, a printed circuit board assembly includes a plurality of LED modules, each LED module being disposed at a corresponding junction, the junctions being connected to bridges in which adjacent bridges define air vents for allowing air to pass through. The bridges and junctions include a multilayer substrate having an insulating layer and a thermal cooling layer in thermal communication with the LED modules. The insulating layer may include a plurality of fluid openings configured for fluid convective heat transfer with the thermal cooling layer.

In yet another variation, a printed circuit board assembly includes a plurality of LED modules and a multilayer substrate. The multilayered substrate may have an external insulating layer and a thermal cooling layer in thermal communication with the LED modules. The external insulating layer includes a plurality of openings which exposes the thermal cooling layer for fluid convective heat transfer.

In yet another variation, a printed circuit board assembly includes a plurality of LEDs having a dome. The LEDs may be disposed in a grid pattern at junctions being interconnected by bridges defining air vents. The bridges include a substrate for activating the LEDs and the substrate includes a front side including the LEDs and an opposing a rear side. Aerodynamic members configured to reduce air pressure are disposed on the second side of the substrate corresponding to location of the junctions. In this way, wind loading may be reduced for multiple directions. Other variations are described in more detail herein.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF THE INVENTION

Figure 1:
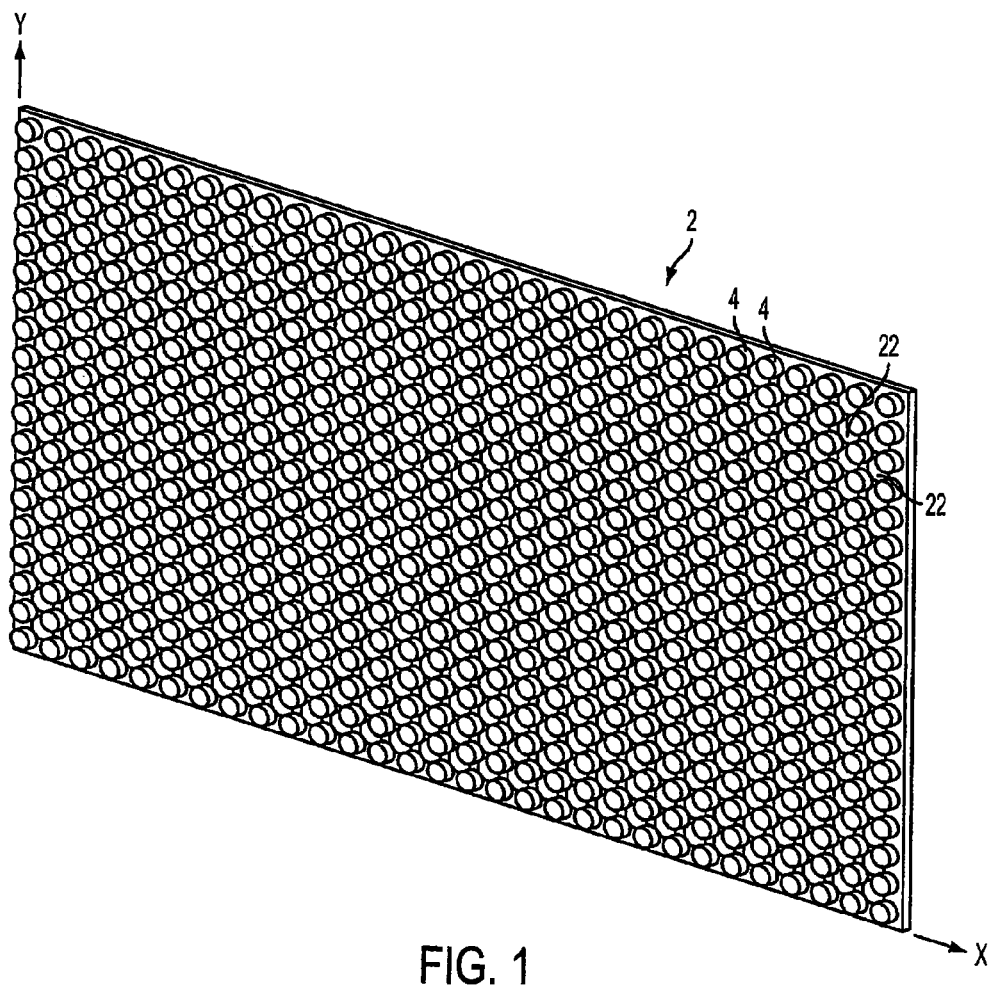
FIG. 1 illustrates a perspective view of a printed circuit board assembly according to one or more aspects of the present invention.
Figure 2:
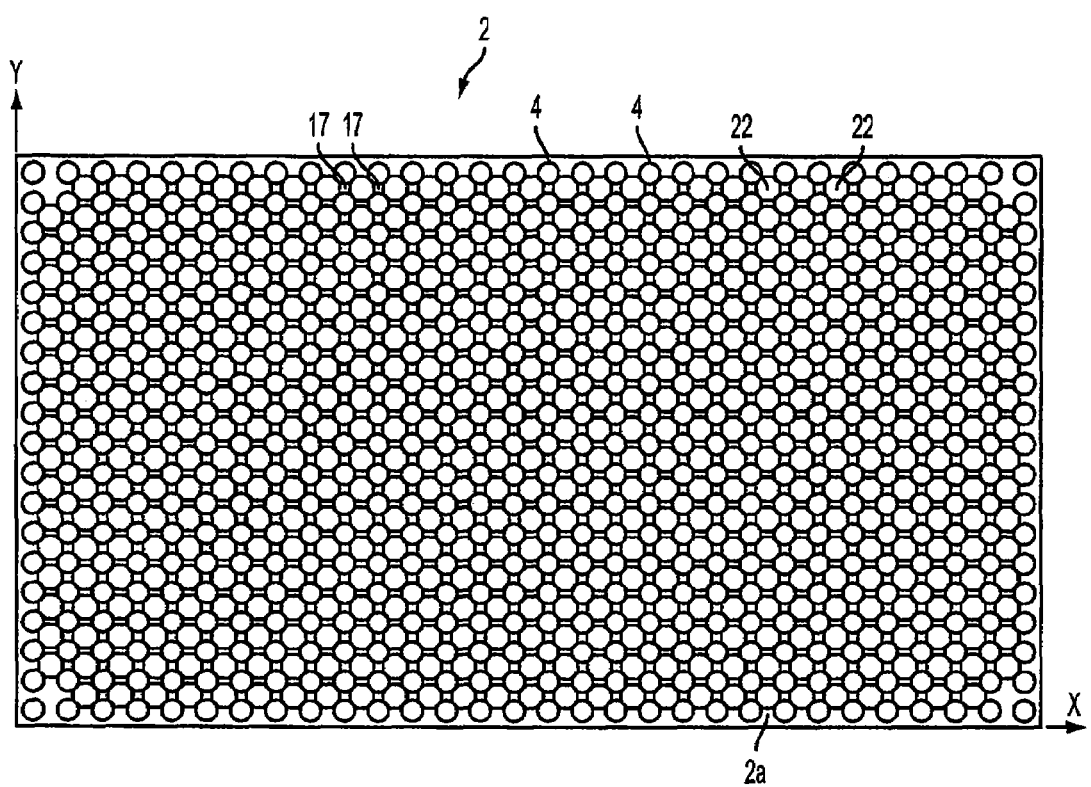
FIG. 2 illustrates a frontal elevation view of the printed circuit board assembly of FIG. 1.
Figure 3:
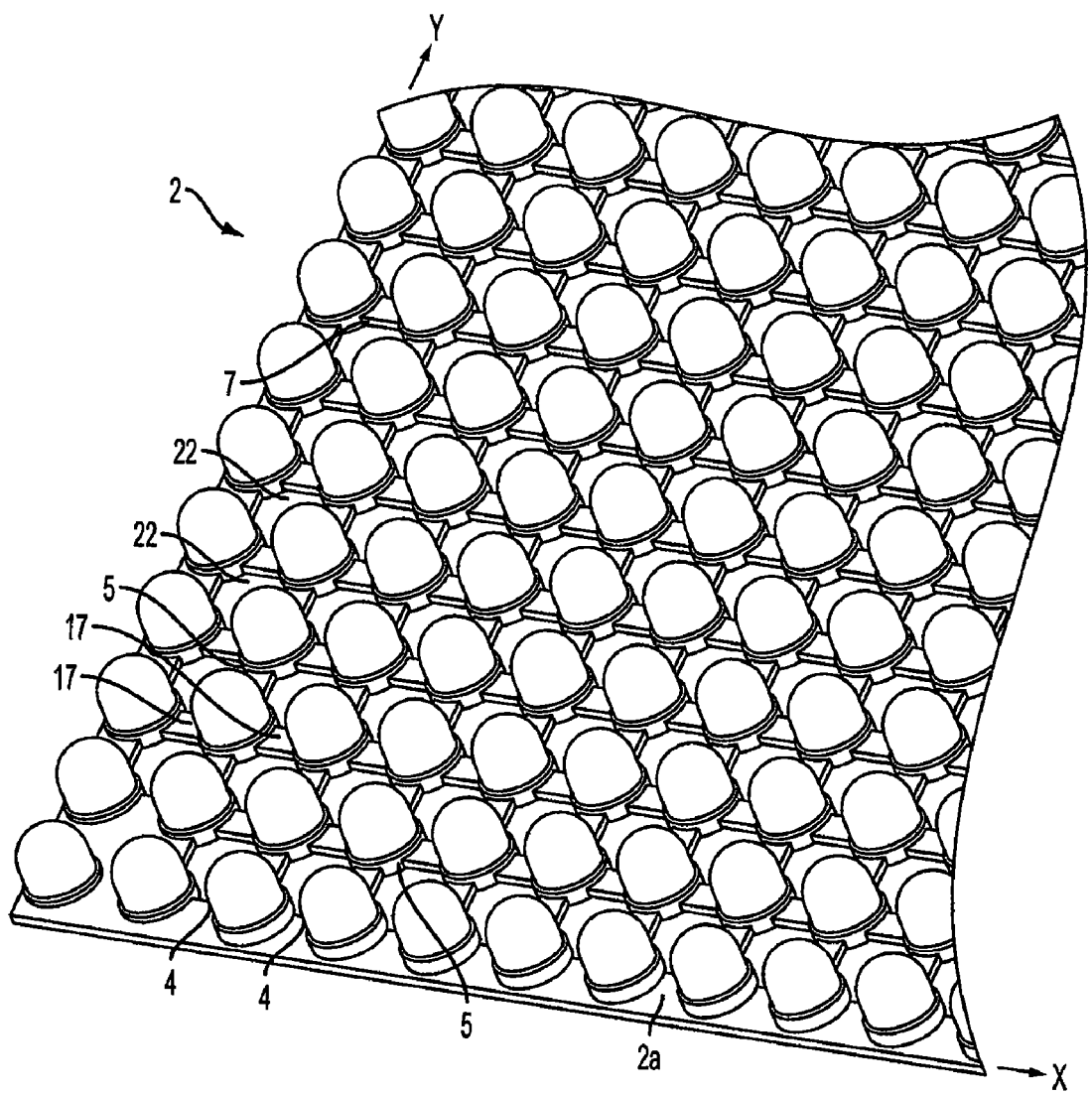
FIG. 3 illustrates an enlarged view of the printed circuit board assembly of FIG. 1 with LED modules.
Figure 4:
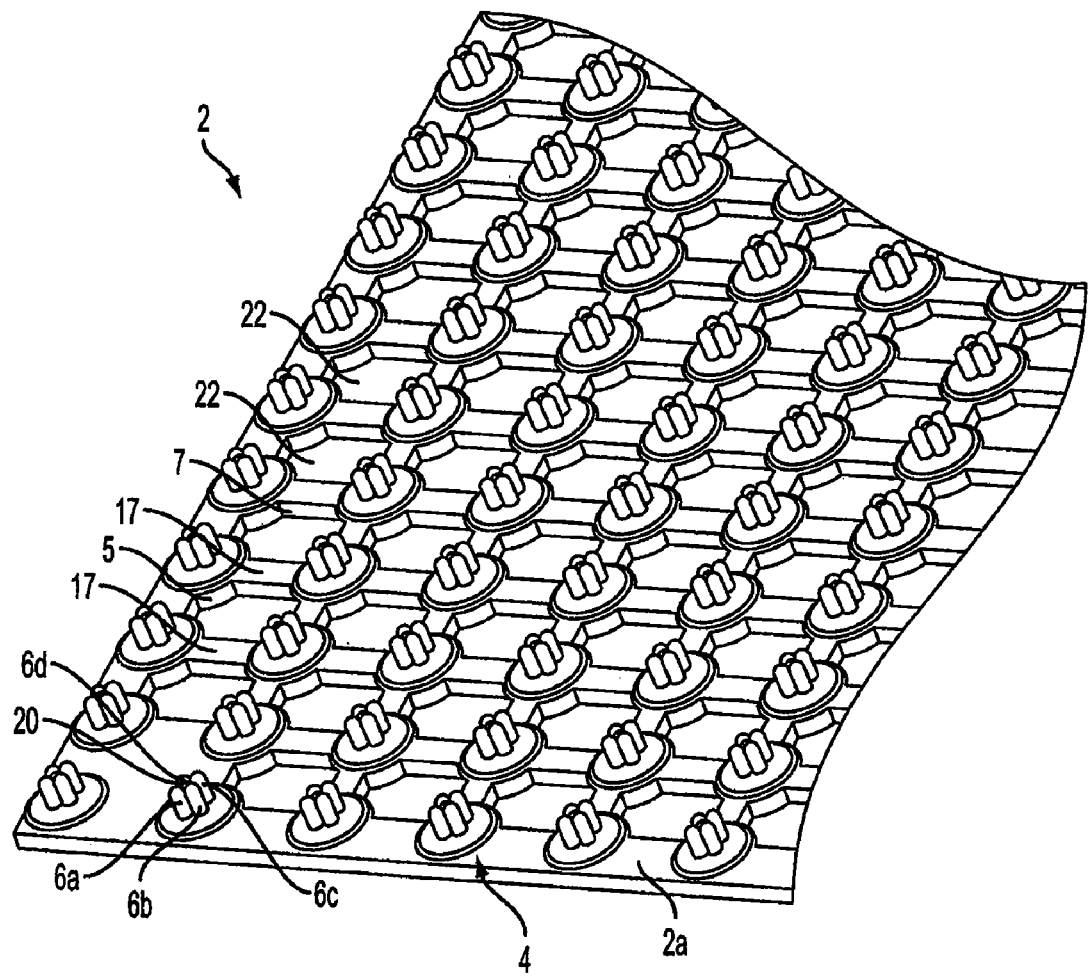
FIG. 4 illustrates an enlarged view of a printed circuit board assembly similar to FIG. 3, with the LED modules according to one or more aspects of the present invention.

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope of the present invention.

FIGS. 1-4 illustrate an embodiment of a printed circuit board (PCB) assembly 2 including an array or grid pattern of light emitting diode (LED) modules 4 mounted thereon. In one arrangement, the LED modules 4 are disposed at intersecting junctions 5 of the PCB assembly 2 in a generally perpendicular X-direction and Y-direction based on a Cartesian coordinate system. The junctions 5 (see FIG. 3) are interconnected by a plurality of bridges 17 defining vents 22, which may be drilled or routed in the printed circuit board. While the terminology "printed circuit board" is used for ease of reference, it should be understood that other types of circuit boards other than printed boards may be used, and such boards are intended to be encompassed within the term "printed circuit board" or PCB. Examples may include embedded wires, ribbon cables, or similar structures.

Figure 5:
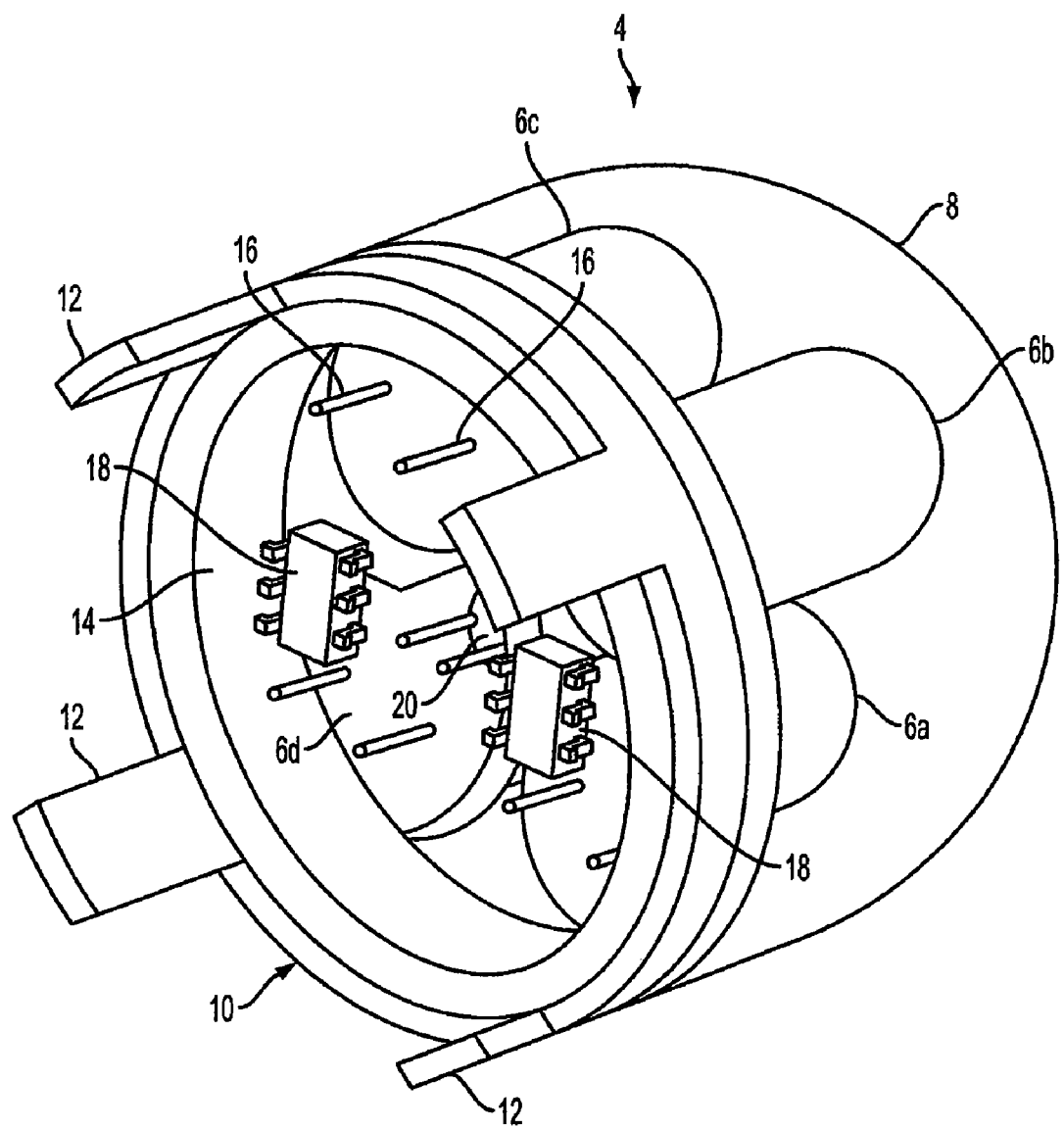
FIG. 5 illustrates a first rear perspective view of an LED module according to one or more aspects of the present invention.
Figure 6:
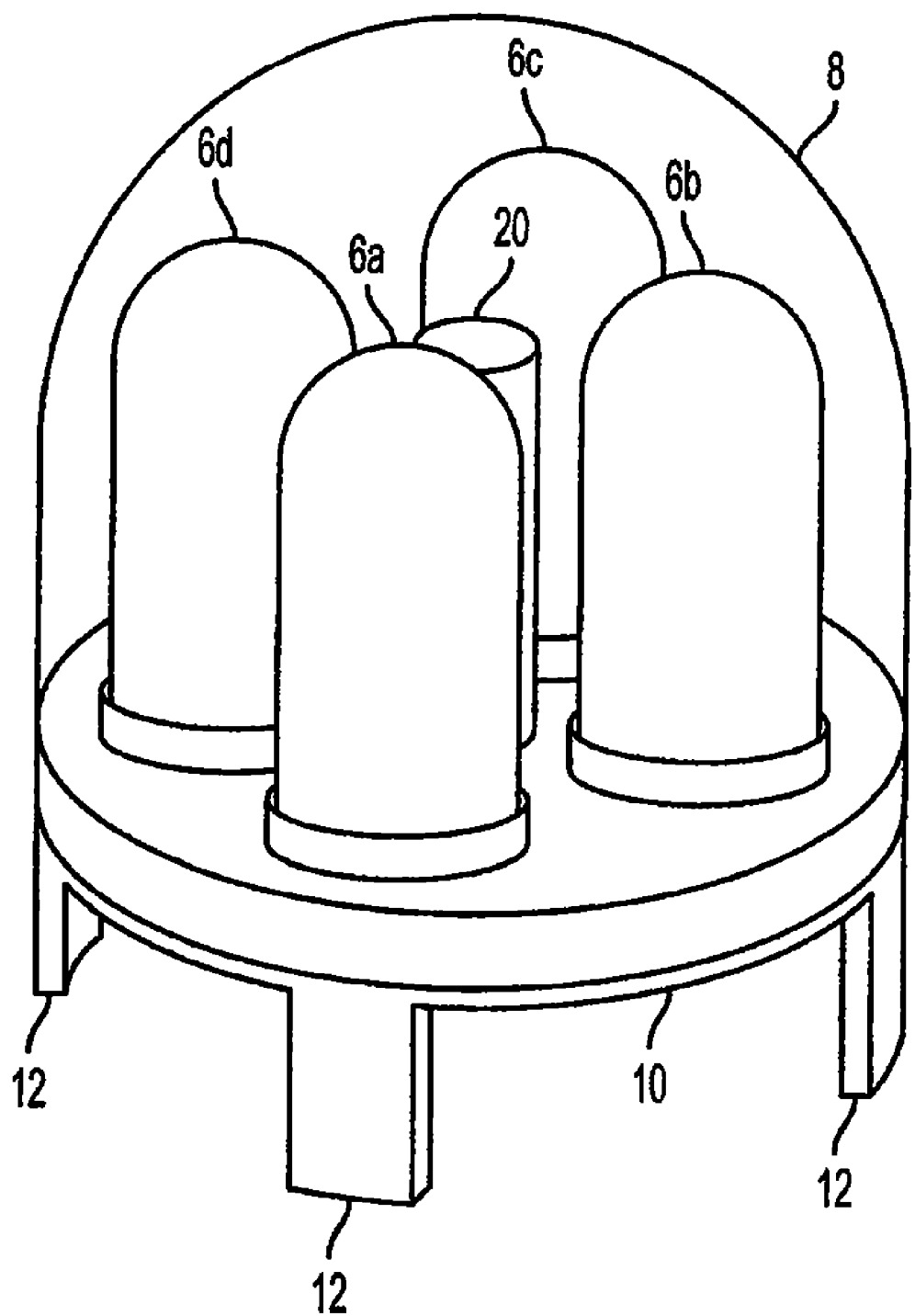
FIG. 6 illustrates a front perspective view of the LED module of FIG. 5 according to one or more aspects of the present invention.
Figure 7:
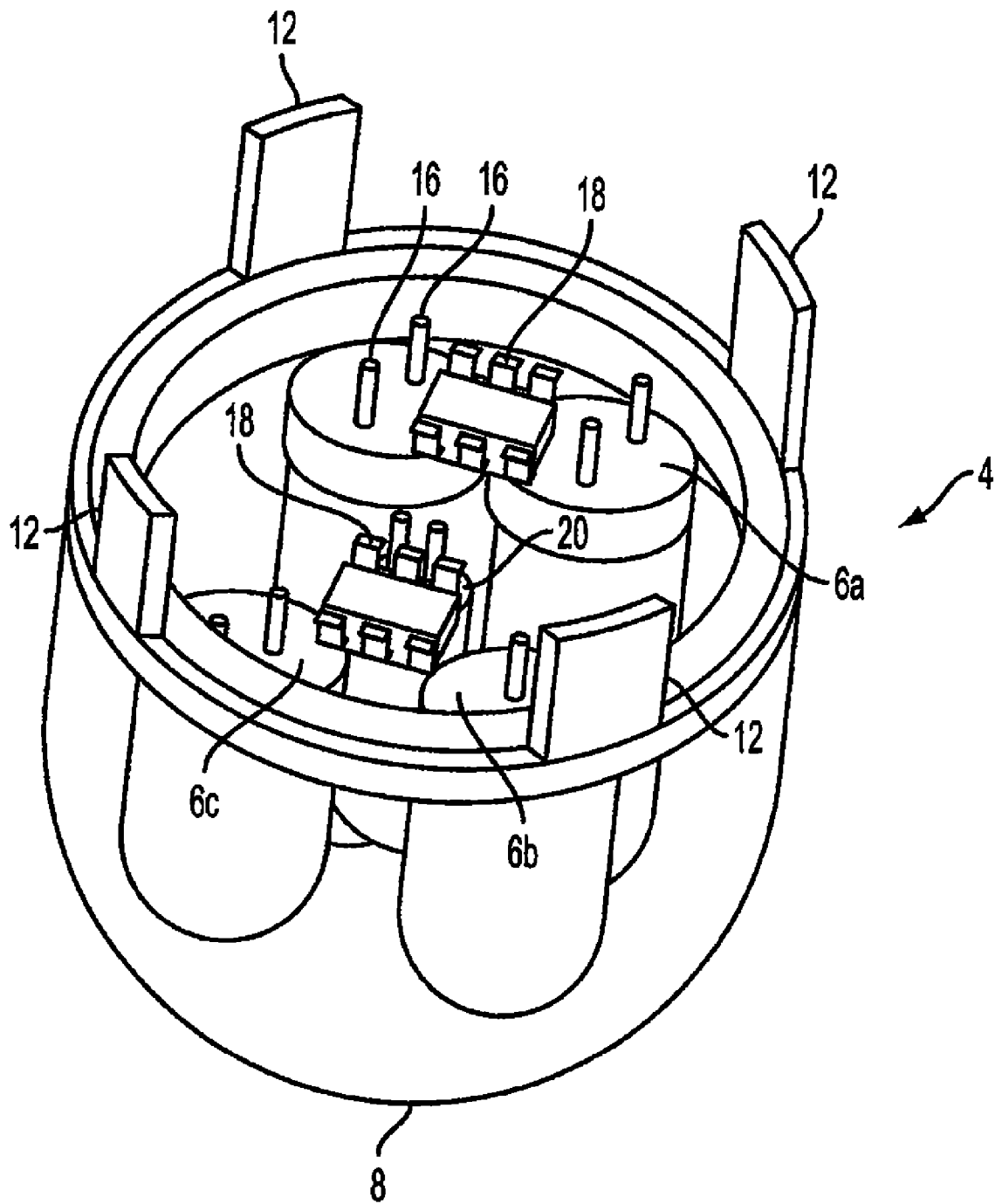
FIG. 7 illustrates a second rear perspective view of a LED module according to one or more aspects of the present invention.

FIGS. 5-7 illustrate an embodiment of an LED module 4 according to one or more aspects of the present invention. LED module 4 may include one or more LEDs 6a-d disposed within the interior cavity of a removable translucent dome or cap 8. The cap is optional and may not be required in all applications. Moreover, while four LEDs 6a-d are shown, the LED module 4 may have more or fewer LEDs depending on the acceptability for the intended use. In one variation, an LED module may consist of a single LED mechanically attached by, for example, soldering to the circuit board.

The dome 8 may be formed of several alternative materials, such as a translucent plastic or glass. Various materials may be selected for atmospheric environments based on the intended use. An appropriate material and thickness characteristics enables the dome 8 to protect the LED 6a-d against physical impingement from flying projectiles in the air or rain, and may help in reducing aerodynamic drag on the assembly. Dome 8 can be optically neutral to preserve the optical characteristics of the LED 6a-d, such as field-of-view focusing. Alternatively, dome 8 may also have optical properties that enhance those of the LED 6a-d, such as lowering the side leakage. The material may also protect the LEDs 6a-d from UV damage that may discolor the optical material or other internal components. The UV protection helps to mitigate brightness reduction of the LEDs 6a-d over time due to exposure to external UV wavelengths. The dome 8 may be removably mounted via a friction-fit engagement to a base member 10. Alternatively, dome 8 may be mounted to the base member 10 in other ways, such as in a snap-fit or threaded engagement. The removable arrangement of the dome 8 provides access for field or bench-level maintenance, such as replacement or upgrade to the LED 6a-d or other components of LED module 4. LED modules may be removed from the PCB assembly for maintenance and the like.

Various techniques may be implemented to permit an LED module to be serviced without being completely removed. For example, the LED module may be attached to the board by a hinge or similar mechanism such that it can be opened without being removed.

In one variation, base member 10 includes extension members or protrusions 12 that may be utilized for mounting the LED module 4 to the PCB assembly 2. In one configuration, the extension members 12 may provide a partial heat transfer path for cooling the LED module 4 in conjunction with PCB 2 assembly substrates. The base member 10 may be composed of a number of alternative materials, including copper, aluminum, or a mixture of metal particulates suspended in a plastic material, carbon fibers or other well known material that provides thermal conductivity without electrical connection.

With continued reference to FIGS. 5-7, in one arrangement, the base member 10 may have an annular or circular shape. Alternatively, base member 10 may be formed in several shape configurations depending on the intended use of the LED module 4. A peripheral surface of the base member 10 may retain a sealing member 14. The sealing member 14 may be configured to prevent debris and other external environmental components from entering into the interior cavity of the LED module 4 formed between the dome 8 and base member 10. The sealing configuration with the dome 8 also provides protection of the LEDs 6a-d against environmental conditions, such as temperature, humidity, salt, acid rain and the like. The sealing member 14 can be formed in several shapes and mounted to the base member 10 using conventional methods and techniques. For example, the sealing member 14 can be formed as an annular ring, such as an O-ring. Further, the sealing member 14 may be composed of a resilient material, such as rubber or a synthetic rubber. For mounting arrangements, the sealing member 14 may be adhesively bonded to the base member 10. Alternatively, the sealing member 14 can provide compression forces for a friction fit engagement with the base member 10.

With reference to FIGS. 5 and 7, each LED 6a-d includes two electrical leads 16 physically connected to respective electrical conductors. Lead material and length may be selected to maximize thermal connection between LED and circuit board for heat dissipation, as discussed in more detail below. While leads 16 are shown, the LED module may have other alternative configurations. For example, the LED module may be surface mounted or a direct-on-die arrangement on the PCB assembly substrate. In such a surface mount configuration, the leads are connected to electrical conductors or traces.

In the most basic configuration, a single LED may be placed at each junction, and may be selectively illuminated by energizing a corresponding X-wire conductor and Y-wire conductor, such that the LED at the junction of the X-wire conductor and Y-wire conductor causes the LED to be illuminated. In other embodiments, more than one LED may be affixed to each junction, such that a single X-wire conductor and Y-wire conductor when energized cause all of the LEDs at the junction to be illuminated. In yet other embodiments, a plurality of X-wire conductors and a plurality of Y-wire conductors (e.g., two in each direction) overlap at the junction, such that more than one pair of conductors is available to selectively illuminate one or more LEDs at the junction. Drivers of various types may be used in association with the LEDS, such that signaling is provided on one set of conductors while power is provided by means of other conductors.

In some embodiments, multiple LEDs at the junction may be selectively energized by means of a decoder that decodes signals on corresponding X-wire conductors and Y-wire conductors such that a larger number of LEDs can be selectively illuminated using a smaller number of conductors.

The LED module 4 may include a decoder unit 18 which may be configured for control of energizing or de-energizing each respective LED 6*a-d* through MOSFET gating or other means. Each decoder unit 18 may be responsive to computer readable commands intended for controlling each LED 6*a-d*. Alternatively, each LED 6*a-d* within the module 4 may be energized simultaneously for increased illumination and brightness characteristics depending on the intended application. For example, applications that may utilize the PCB assembly 2 could be a vehicular or aircraft traffic signage; large screen video displays; and computerized video billboards and the like.

In the arrangement shown in FIGS. 5 and 7, each decoder unit 18 may have six leads for various logic control functions with a computer and the like. One of ordinary skill would recognize that each decoder unit 18 may have more or fewer electrical leads for carrying out the intended control operation. The LED module 4 may include a heat resistor 20 disposed between the LEDs 6*a-d*. The heat resistor 20 may be energized when defogging or deicing of the dome 8 or other internal components is needed. If desired, one of the decoder units 18 may be configured to control the heat resistor 20. Alternatively, a separate electrical conductor connected to a switch (not shown) may control operation of the heat resistor 20.

Figure 9:
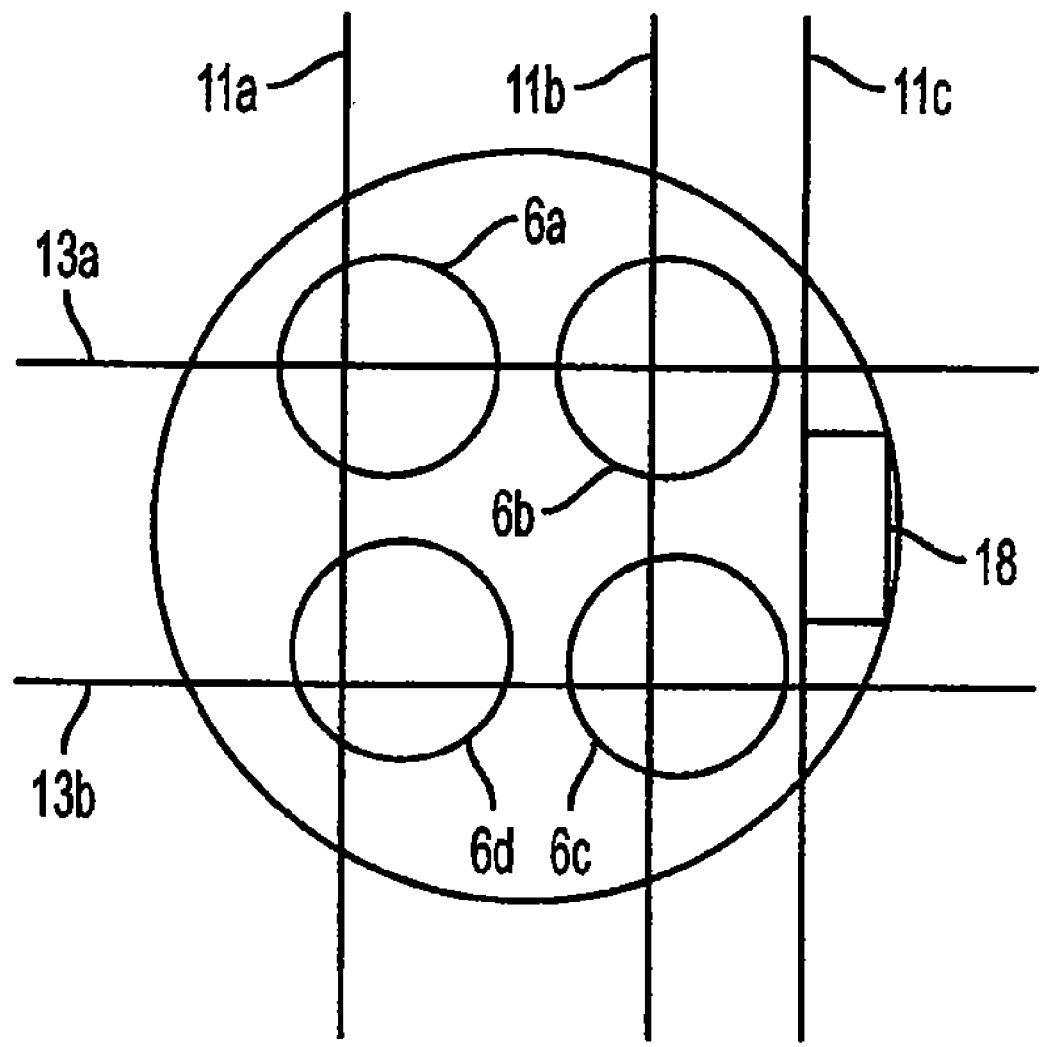
FIG. 9 illustrates a schematic diagram of one possible decoder-conductor arrangement for energizing components of a LED module according to one or more aspects of the present invention.

With reference to FIG. 9, in one arrangement, the PCB assembly at the junctions 5 may include electrical conductors 11*a-c* and 13*a-b*. The conductors may be provided in a two-by-three array for selectively energizing the intended LED 6*a-d* within the LED module 4. More or fewer conductors may be used depending on the desired configuration. Conductor 11*c* can be used for providing power or other signals to the decoder unit 18. The decoder unit 18 may be connected to the electrical conductors 11*a-c* and 13*a-b* in a conventional manner to enable control of LEDs 6*a-d*.

Figure 14:
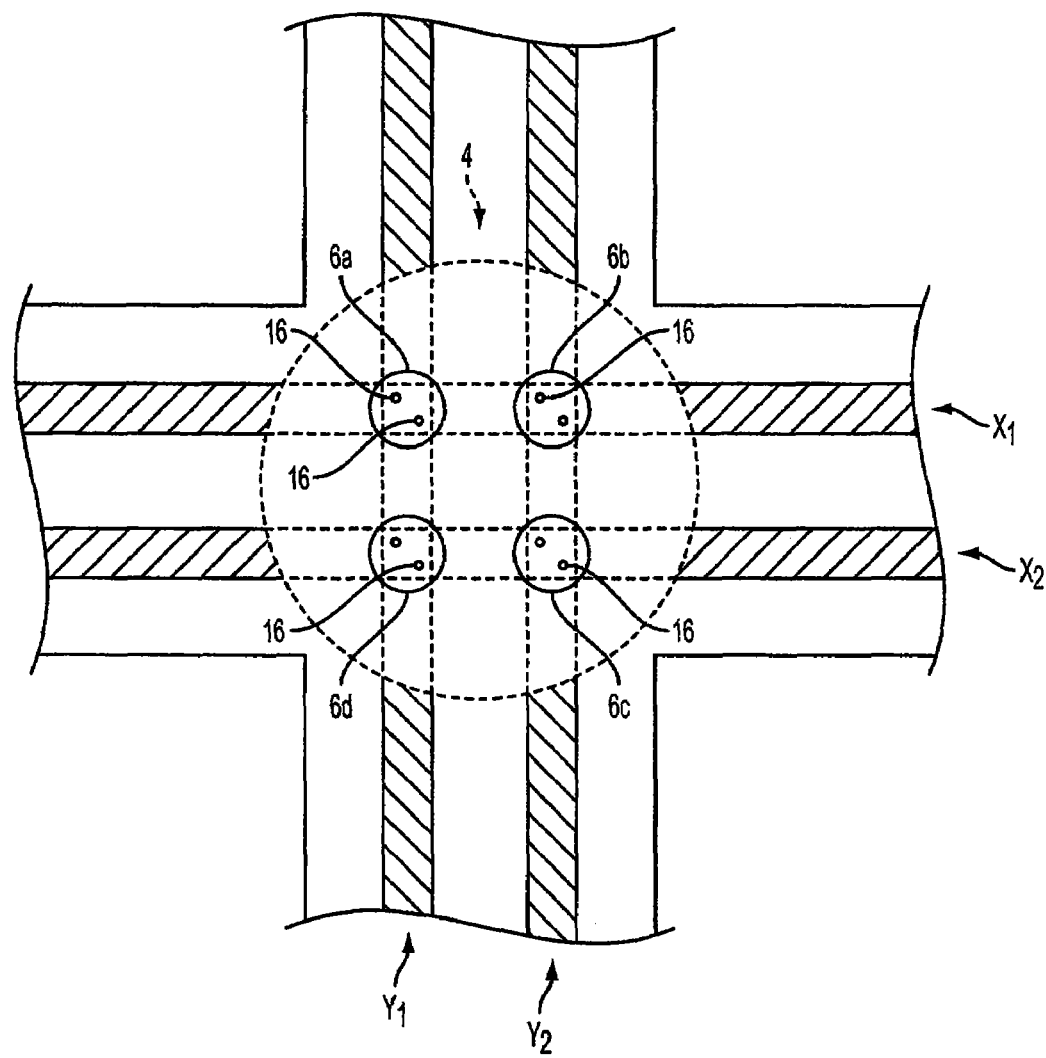
FIG. 14 illustrates a schematic diagram of a conductor-LED module arrangement according to one or more aspects of the present invention.

FIG. 14 illustrates one possible arrangement of conductors and an LED module 4 at the junction 5 without a decoder unit controlling the LED module. In one embodiment, the PCB assembly 2 may be constructed in a multilayered arrangement in which the different conductive layers include conductors in the X-direction and the Y-direction, separated by an insulating layer. FIG. 14 shows a two-by-two array of conductors x1, x2 and conductors y1, y2 disposed on different conductive layers for energizing LEDs 6*a-d*. In operation, each LED 6*a-d* may be energized in a number of different configurations. For example, LED 6*a* may be energized with conductor x1 and conductor y1; LED 6*b* may be illuminated with conductor x1 and conductor y2. LED 6*c* can be illuminated with conductor x2 and conductor y2. LED 6*d* may be energized by conductor x2 and conductor y1. Nonetheless, all the conductors x1-2 and y1-2 may be used to illuminate all the LEDs 6*a-d* for increased brightness. While LED modules with four LEDs have been shown, a single LED may be disposed at the junctions and operate with or without a decoder unit. In this approach, the LEDs 6*a-d* can be addressable by the conductor arrangement.

Figure 10:
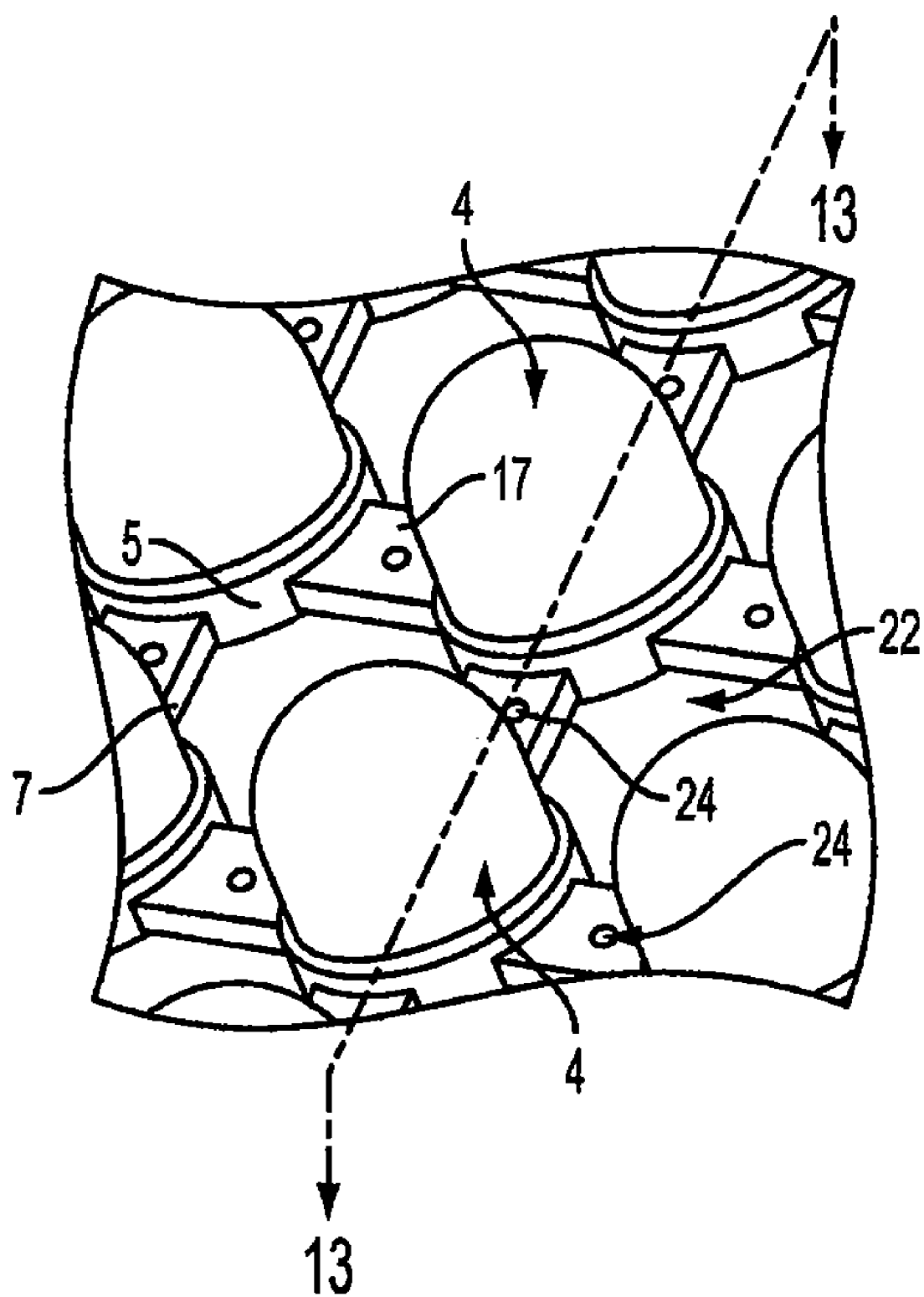
FIG. 10 illustrates an enlarged view of the PCB assembly of FIG. 1 with a first heat dissipation feature according to one or more aspects of the present invention.
Figure 11:
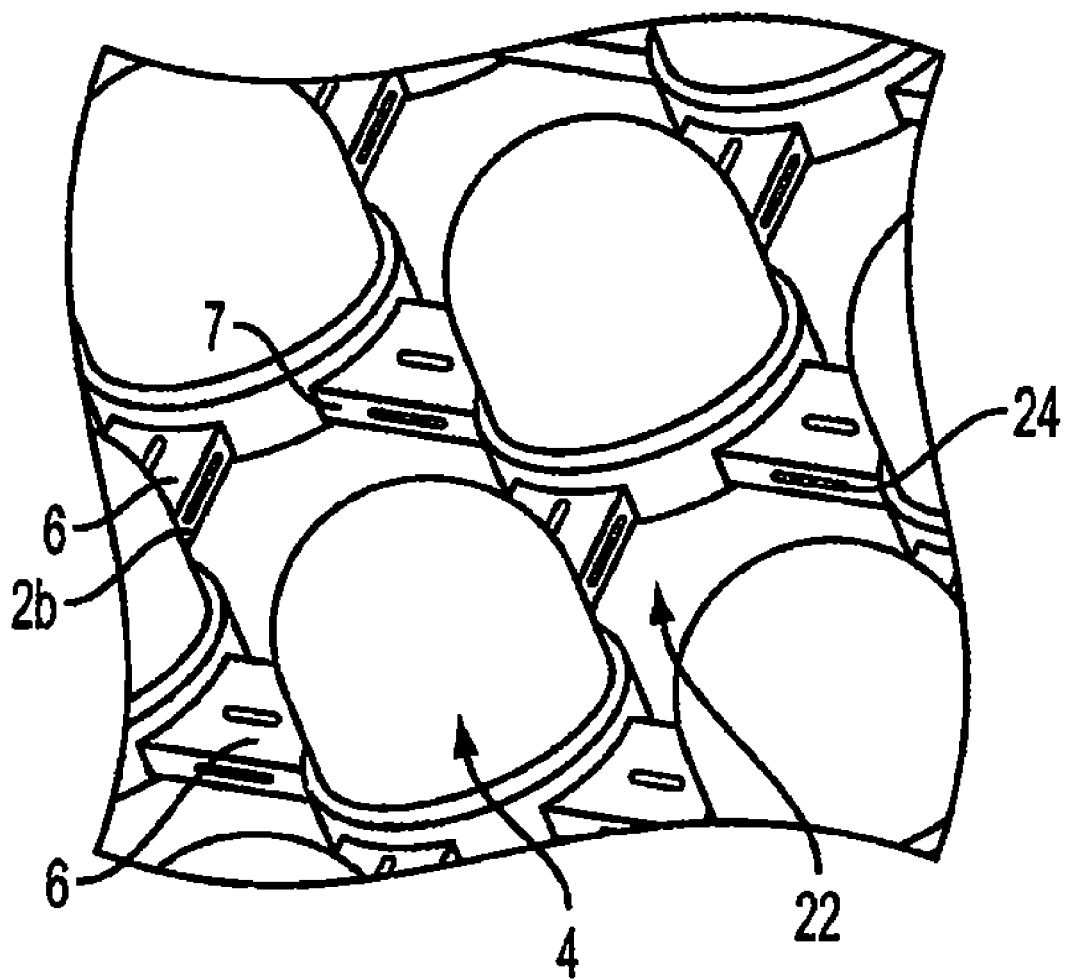
FIG. 11 illustrates an enlarged view of the PCB assembly of FIG. 1 with a second heat dissipation feature according to one or more aspects of the present invention.
Figure 12:
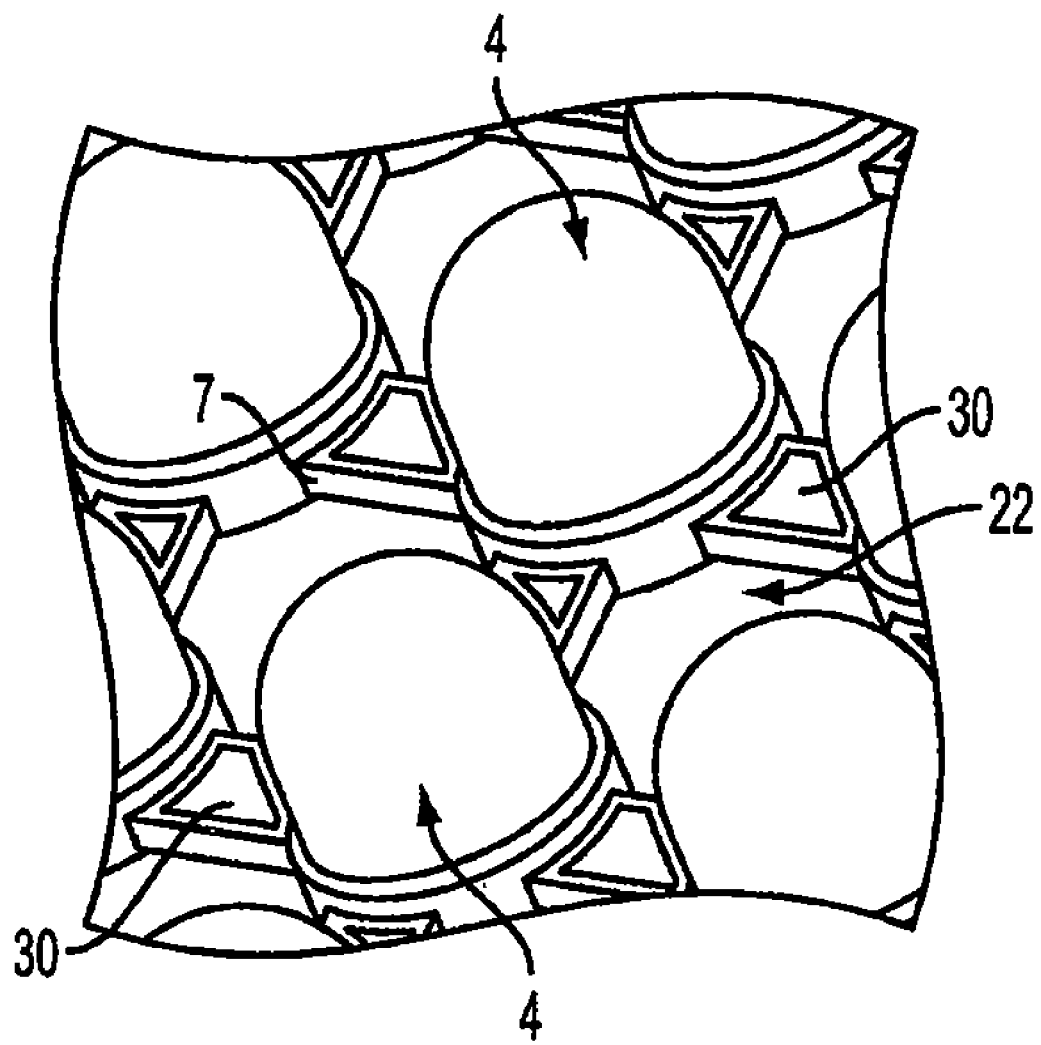
FIG. 12 illustrates an enlarged view of the PCB assembly of FIG. 1 with a third heat dissipation feature according to one or more aspects of the present invention.

FIGS. 10-12 illustrate alternative arrangements of the PCB assembly 2 for providing heat dissipation for cooling the LED modules. The PCB assembly 2 includes thermodynamic cooling features and aerodynamic features, such as a plurality of air vents 22. The vents 22 enable air to pass through the PCB assembly 2 to reduce wind pressure on the PCB assembly and may assist with heat dissipation. This vent configuration advantageously enables the PCB assembly to be implemented in high environments and prevents excessive wind loading. Additionally the air vents 22 are configured for removing the heat generated by the LED modules 4 and other electrical components. The cooling exchange provided by the vents 22 reduces localized hot spots in the PCB assembly 2.

As can be seen in FIGS. 1-4 and 10-12, the junctions 5 are connected by bridges 17 in which the air vents 22 are defined between the bridge and junctions. The multilayer substrate includes the bridges 17. The air vents 22 are devoid of material between four adjacent junctions 5 and bridges 17. As can be seen in the FIGS. 10-12, the air vents 22 are generally shaped as a square configuration. Nonetheless, other shapes are possible. The bridges 17 have a width smaller than the diameter of the junctions 5. A ratio of the width of the bridges to the diameter of the junctions is less than one. This is one way of controlling the size of the vents by controlling the width of the bridges 17. Advantageously, this configuration reduces wind pressure on the PCB assembly 2. In an exposed environment, the air may flow through the vents 22 for passive cooling of the LED modules 4 by way of natural convection.

In an enclosed arrangement, fluidic cooling of the PCB assembly 2 can be implemented by providing a cooling fluid of sufficient velocity and a volume to flow over the LED modules 4 and through the fluid vents 22. The cooling fluid may flow in a direction parallel to a plane formed by the X-direction and Y-direction. Alternatively, the cooling fluid with sufficient volume and velocity may flow primarily through the air vents 22 by being directed generally perpendicular of the plane of the PCB assembly 2. A cooling fluid may be a gas, such as ambient air, drawn external to the PCB assembly 2 in an enclosed arrangement. Alternatively, the cooling fluid could be recirculated air after heat is removed via an air conditioning device (not shown). The heat is removed from LED modules 4 by convection.

Figure 8:
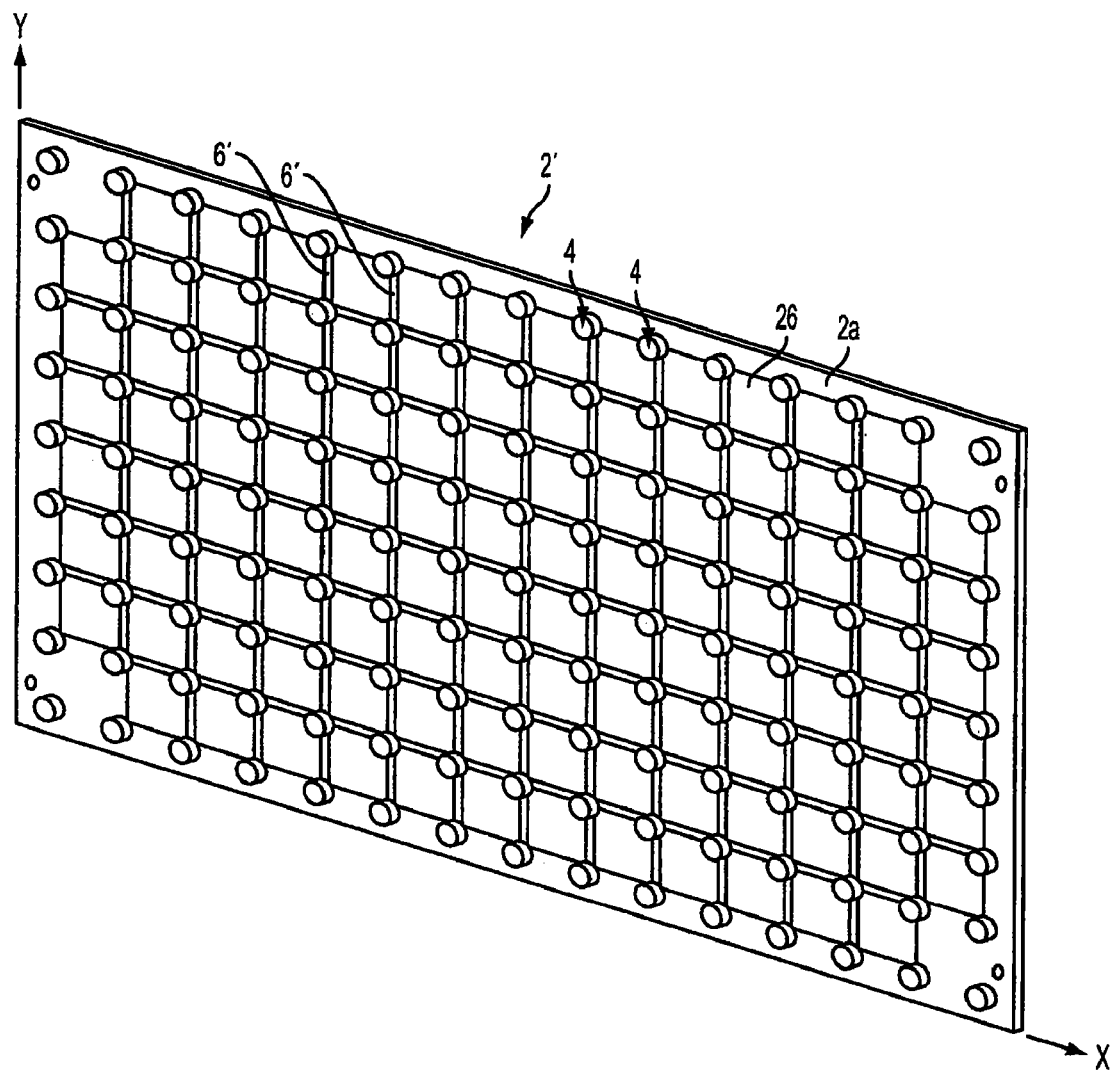
FIG. 8 illustrates a perspective view of an alternative embodiment of a printed circuit board assembly according to one or more aspects of the present invention.

FIG. 8 shows an alternative PCB assembly 2' with large size vents 26 to promote additional air passing through PCB assembly and additional cooling of the LED modules 4. The size of the vents 26 are controlled by the width of the bridges 6' and the length. This configuration enables more air to pass through the vents 26 for reducing wind loading and subsequent stress on the structure. PCB assembly 2' has similar components of PCB assembly 2. PCB assembly 2' may be used with other aspects of heat dissipation and aerodynamic features of the present invention. As can be seen in FIG. 8, the size of the vents is many times the size of each LED module, thus providing a minimal cross-section to wind.

Figure 13:
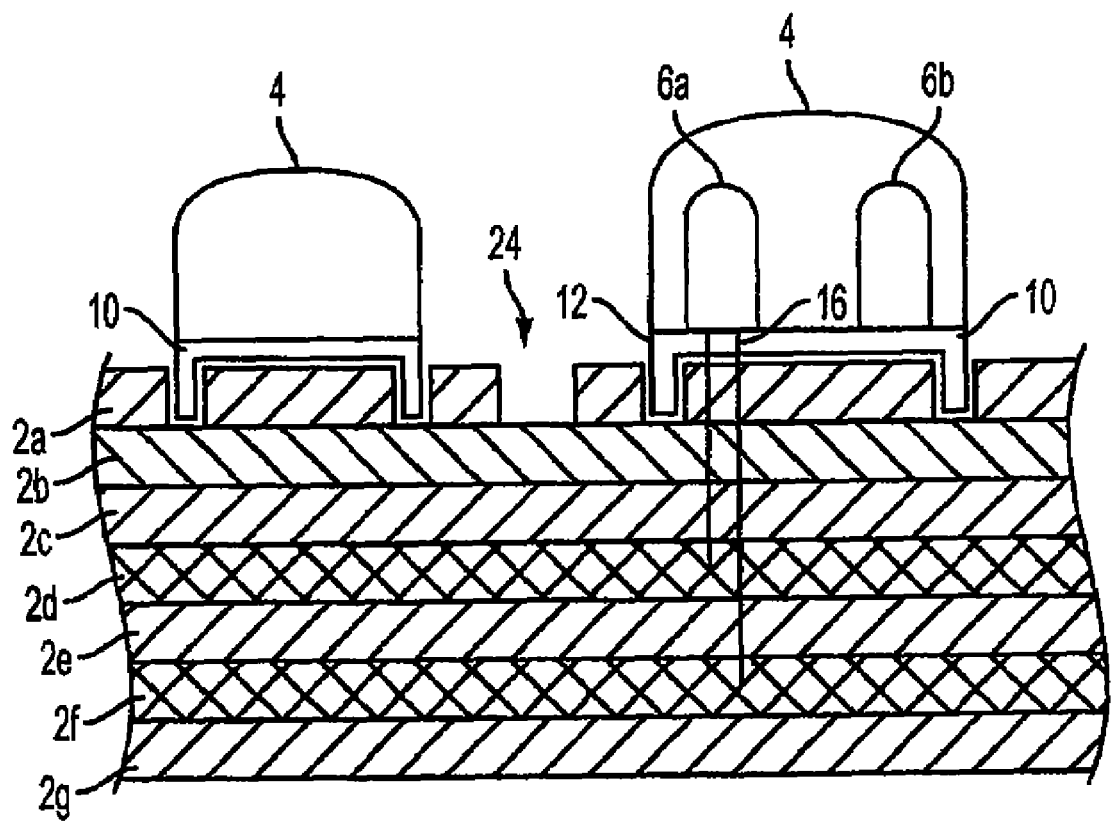
FIG. 13 illustrates a partial schematic section view of the printed circuit board assembly taken along line 13-13 of FIG. 10.

FIG. 13 shows a section view of the PCB assembly 2 taken along line 13-13 of FIG. 10. With reference to FIG. 13, the PCB assembly 2 may be constructed in a multilayered arrangement comprising a plurality of layers 2*a-g*. In such an arrangement, layers 2*a*, 2*c*, 2*e* and 2*g* may be composed of a dielectric insulator. A thermal conductive layer 2*b* may be disposed between the outer layer 2*a* and a dielectric insulator layer 2*c*. A first electrical conductive layer 2*d* may be disposed between dielectric insulator layers 2*c* and 2*e*. A second electrical conductive layer 2*f* may be disposed between insulator layers 2*e* and 2*g*. The substrate may have more or fewer layers and other arrangements of the layers are possible. In the embodiments shown in FIG. 10-12, the sidewalls 7 may also be the outer layer 2*a* of the multilayer substrate. The PCB assembly 2 may be manufactured using conventional multilayered conductor techniques. The leads 16 of LEDs 6*a* may extend through holes in the dielectric layer 2*a*, thermal conductive layer 2*b*, and dielectric layers 2*c*, 2*e* to the conductive layers 2*d* and 2*f*. In another example, each lead 16 may be same length and the holes may include metal deposits through conventional manufacturing methods to enable electrical current to flow from the conductor layers to each lead 16. The thermal conductive layer 2b may be thermally insolated from the leads 16 and the holes.

With reference to FIGS. 10, 11 and 13, in one arrangement, the dielectric outer layer 2a of the PCB assembly 2 may have a plurality of fluid openings 24 for exposing a thermal conductive layer 2b for air communication to increase the effective convective contact area to allow heat dissipation of the LED modules 4. The openings 24 are devoid of a dielectric material so as to form pathways in which a flowing cooling fluid, such as air, may contact the thermal conductive layer 2b to receive heat. In such an arrangement, the air may enter the opening 24 and the air is prevented from flow through the PCB by the thermal conductive layer 2b. In FIGS. 10 and 13, the openings 24 may have a circular shape. Nevertheless, the openings 24 may have other shapes depending on a desired cooling performance with respect to the convective contact area. For example, the shapes may be square, rectangular, triangular, oval, and the like.

As shown in FIG. 11, the openings 24 may be in the form of the slots in the dielectric outer layer 2a. The openings 24 may be disposed on the top surface of the PCB assembly substrate. Alternatively, the openings 24 may be located on a sidewall 7 in the vents 22 of the PCB assembly substrate. The sidewall 7 arrangement of the opening 24 in combination with a cooling fluid, such as air, flowing through the vents 22 provides an incremental heat transfer advantage by enabling increased fluid exchange with the thermal conductive layer 2b. The material of the thermal layer 2b may have an appropriate heat transfer coefficient based on the heat generating characteristics of the LED modules 4. The thermal conductive layer 2b can be composed of a number of alternative materials, including a copper, aluminum, or a mixture of metal particulates suspended in a plastic material. The thermal coefficient of thermal expansion of the conductive layer and dielectric layers would be matched to take into account any thermal induced mechanical stress. If desired, small holes may extend all the way through the substrate in the bridge 17 so air can pass through the bridge. The small holes may be placed proximate to the LED modules to close proximity to the location of heat generation. In this way, there is the possibility of obtaining improved heat dissipation.

With reference to FIG. 13, to transfer heat from the LED module 4, the thermal conductive layer 2b may be physically connected to the base member 10, in particular to the protrusions 12 of the LED module 4. In one configuration, the base member 10 may serve as a heat sink with respect to the LEDs 6a-d. The thermal conductive layer 2b may be a lower temperature than the LED module 4. Thus, a resultant thermal temperature differential enables the heat generated by the LED 6a-d to be transferred to the base member 10 and to the thermal conductive layer 2b. To enhance cooling of the PCB assembly 2, in one embodiment, a thermoelectric cooling module (not shown) may be used to lower the temperature of the thermal conductive layer 2b. This creates an enhanced heat sink performance for the thermal layer. The thermoelectric cooling module may be powered with the conductors from layers 2d and 2f.

Figure 16:
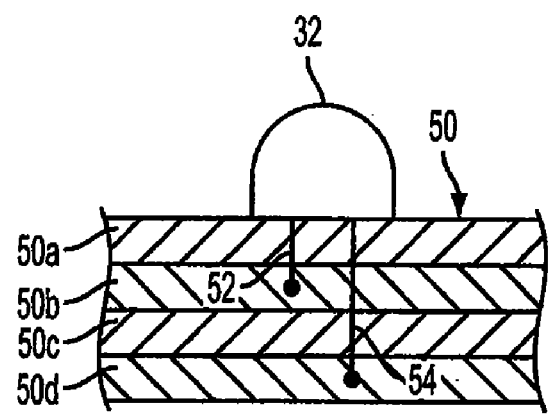
FIG. 16 illustrates a partial schematic section diagram of an alternative multilayer substrate arrangement according to one or more aspects of the present invention.

FIG. 16 illustrates a section view of an alternative multilayer substrate 50 with an LED 32. LED 32 includes a cathode lead 52 and an anode lead 54 for receiving electrical power. The lead 52 of LED 32 may be connected to trace layer 50b. The lead 54 of LED 32 may extend to trace layer 50d. To maximize the heat dissipation performance, the thermally conductive layer(s) 50a and 50c may be disposed in close proximity to the trace/layer 50b which is thermally and electrically connected to the cathode lead 52 of the LED. As shown in FIG. 16, either side of the trace layer 50b can be sandwiched by the thermal layer(s) 50a and 50c to provide maximum thermal dissipation and/or heat sinking. Thermal layer 50c may be disposed between the trace layer 50b and layer 50d. Hence, a single thermal conductive layer may simultaneously provide heat transfer benefits for both trace layers. This configuration may also reduce the thickness of the substrate 50.

While a single LED is shown, the inventive aspects can be practiced with multiple LEDs or LED modules. Multilayer substrate 50 may be used with PCB assembly 2 shown in FIGS. 1-4 and the air vents 22 for maximum heat conduction. The thermal conductive layer 50a and 50c may be composed of various materials which provide thermal conduction yet high electrical resistance, including polymeric, polymeric blends, or carbon fibers.

FIG. 12 illustrates an alternative heat dissipation arrangement including an outer exposed layer 30 which may serve both electrical and thermal conductive functions. In this arrangement, the convective contact area is increased for cooling the LED module or LEDs in the cooling configuration. The layer 30 may serve as an electrical conductor for the LED module or LEDs.

Figure 15:
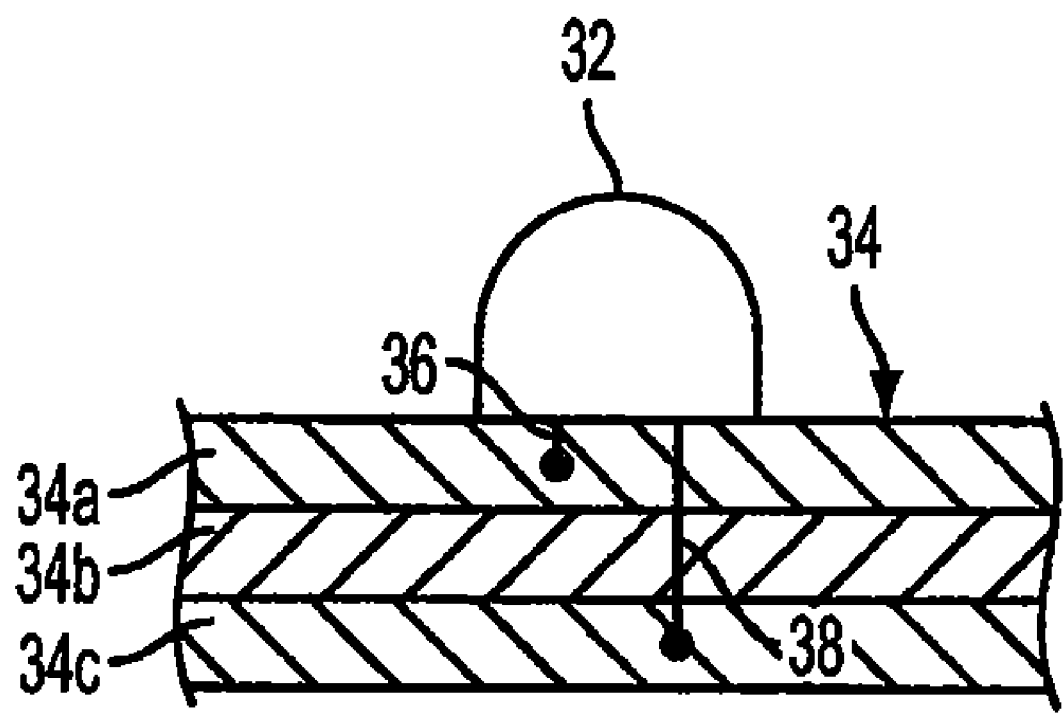
FIG. 15 illustrates a partial schematic section view of an alternative multilayer substrate arrangement according to one or more aspects of the present invention.

FIG. 15 illustrates a section view of an alternative multilayer substrate 34 with an LED 32. Multilayer substrate 34 includes an exposed upper layer 34a that serves as both an electrical conductor and a thermal conductor for heat dissipation. Upper layer 34a may include one or more conductors in the X-direction. A bottom electrical conductive layer 34c may include one or more conductors in the Y-direction. A dielectric insulating layer 34b may be disposed between the layer 34a and layer 34c. LED 32 includes two lead 36, 38 for receiving electrical power. The lead 36 of LED 32 may be connected to upper layer 34a. The lead 38 of LED 32 may extend through holes in layer 34a, and dielectric layer 34b to the conductive layer 34c. While a single LED is shown, the inventive aspects can be practiced with multiple LEDs or LED modules. Multilayer substrate 34 may be used with PCB assembly 2 shown in FIGS. 1-4 and the heat dissipation vents 22. In this embodiment, electrically and thermally conductive layer 34a assists in dissipating heat from LED 32.

In another variation, layer 34a may comprise a thermally conductive layer that has poor electrical conducting qualities, thus helping to dissipate heat while acting as an electrical insulator. Layer 34b could then be used as the electrical path to LED 32, and another layer 34d (not shown) would act as the other electrical conductor. In this variation, LED leads 36 and 38 would be connected to layers 34b and 34d (not shown) for electrical connectivity.

Figure 17:
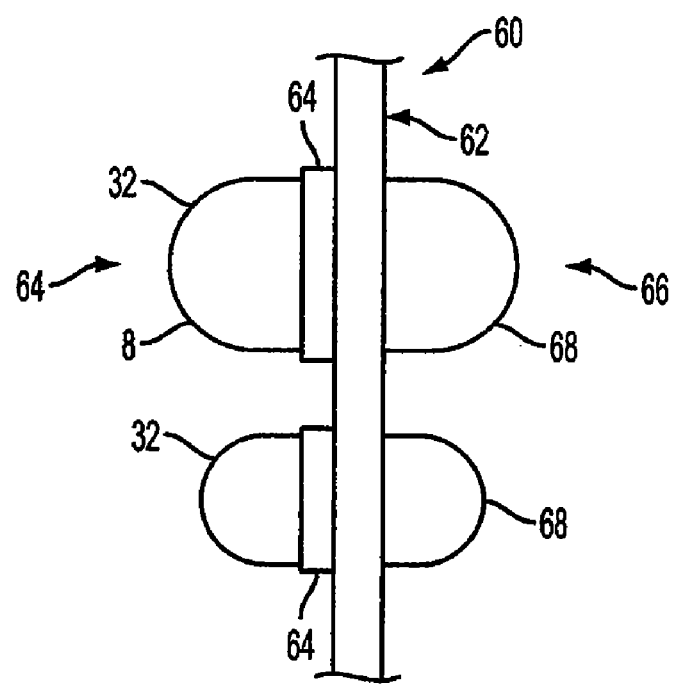
FIG. 17 illustrates a partial schematic diagram of an alternative PCB assembly according to one or more aspects of the present invention.

FIG. 17 illustrates a partial schematic diagram of an alternative PCB assembly 60 with a two-sided aerodynamic configuration which provides a benefit of reducing wind pressure. In this configuration, the substrate 62 has a front side 64 and rear side 66. The LED module 32 may mounted on the front side 64 and the LED module 32 may include a dome 8. The rear side of the PCB assembly 60 may include an aerodynamic member 68 for reducing wind pressure. The PCB assembly 60 includes air vents (not shown) for enabling air to pass through the PCB. Air flowing towards the LED module 32 of dome 8 can reduce air pressure, and air flowing in an opposite direction also has reduced resistance with respect to the structure. The aerodynamic member may comprise various shapes such as a hemispherical shape or a nose cone shape.

Figure 18:
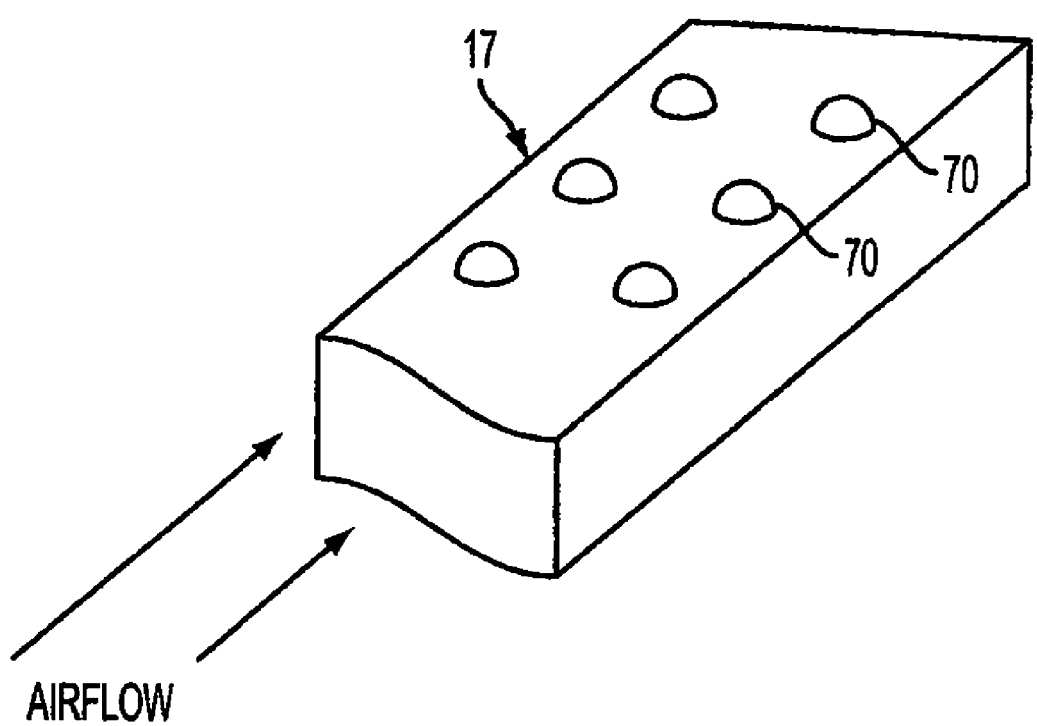
FIG. 18 illustrates a partial schematic diagram of a PCB assembly with roughness members according to one or more aspects of the present invention.

Other configurations of the PCB assembly are possible to increasing heat dissipation. In one arrangement shown in FIG. 18, the bridge 17 may include a plurality of roughness members 70 on the surface of the multilayer substrate. The roughness members 70 protrude from the surface of the substrate. The members 70 can have a variety of shapes, such as hemispherical and the like. These roughness members 70 may be provided to promote small air turbulence to reduce the boundary layer for reducing the insulating effects of the air and promote increased heat transfer from the thermal layer to the air. Thus, in the embodiments of exposing the thermal layer to the air, roughness members 70 may increase the interaction of the air with the thermal layer to improved passive cooling. One of ordinary skill in the air may embodiment computational fluid mechanics and the like for specific dimensional characteristics.

While the present invention has been described with reference to preferred embodiments, it will be understood by those of ordinary skill in the art that various changes may be made and equivalents may be substituted for elements without departing from the scope of the invention. In addition, many modifications may be made to adapt a particular feature or material to the teachings of the invention without departing from the scope thereof. Therefore, it is intended that the invention not be limited to the particular embodiments disclosed, but that the invention will include all embodiments falling within the scope of the appended claims.

The invention claimed is:

1. A circuit board LED display, comprising:
a substrate comprising a first electrical layer and a second electrical layer electrically insulated from the first electrical layer, wherein the substrate is formed in a grid pattern having junctions at the intersection of bridges defining air vents through which air can freely pass through the substrate, wherein the substrate comprises a thermally conductive and electrically resistive layer to which the plurality of LEDs are attached, wherein the first electrically conductive layer is formed below the thermally conductive and electrically resistive layer; and
a plurality of LEDs arranged at the junctions and electrically connected to the first electrical layer and the second electrical layer.

* * * * *